(12) United States Patent
Lee

(10) Patent No.: US 8,129,094 B2
(45) Date of Patent: Mar. 6, 2012

(54) METHOD FOR MANUFACTURING A SEMICONDUCTOR DEVICE

(75) Inventor: Ki Lyoung Lee, Hwaseong-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 809 days.

(21) Appl. No.: 12/163,836

(22) Filed: Jun. 27, 2008

(65) Prior Publication Data

US 2009/0162792 A1    Jun. 25, 2009

(30) Foreign Application Priority Data

Dec. 20, 2007  (KR) .................. 10-2007-0134550

(51) Int. Cl.
*G03F 7/26* (2006.01)
(52) U.S. Cl. ...................................... 430/314
(58) Field of Classification Search .......... 430/311, 430/313, 314
See application file for complete search history.

(56) References Cited

U.S. PATENT DOCUMENTS

| | | | |
|---|---|---|---|
| 5,328,810 | A | 7/1994 | Lowrey et al. |
| 6,383,952 | B1 | 5/2002 | Subramanian et al. |
| 2002/0160553 | A1* | 10/2002 | Yamanaka et al. ........... 438/149 |
| 2006/0211260 | A1 | 9/2006 | Tran et al. |
| 2007/0123019 | A1* | 5/2007 | Lim et al. ........... 438/611 |
| 2008/0076070 | A1* | 3/2008 | Koh et al. ........... 430/311 |

FOREIGN PATENT DOCUMENTS

WO    WO2005013320 A2    2/2005

* cited by examiner

*Primary Examiner* — Kathleen Duda
*Assistant Examiner* — Brittany Raymond
(74) *Attorney, Agent, or Firm* — Kilpatrick Townsend & Stockton LLP

(57) ABSTRACT

A spacer is formed on side and top portions of a photoresist pattern after a mask process is performed so that the spacer may be used as an etching mask. The spacer is formed using a polymer deposition layer which is a low temperature oxide or nitride that can be deposited on side and top portions of the photoresist pattern at 75~220° C. after the mask process is performed. A method for manufacturing a semiconductor device includes forming a bottom anti-reflection coating film on an etch-target layer, patterning a photoresist layer formed on the bottom anti-reflection coating film, forming an insulation layer on a patterned photoresist layer and the bottom anti-reflection coating film, etching back the insulation layer to form a spacer on sidewalls of the patterned photoresist layer, and etching the bottom anti-reflection coating film and the etching target layer exposed by the spacer to form a fine pattern.

15 Claims, 6 Drawing Sheets

METHOD FOR MANUFACTURING A SEMICONDUCTOR DEVICE

CROSS-REFERENCE TO RELATED APPLICATION

Priority is claimed to Korean patent application number 10-2007-0134550, filed on Dec. 20, 2007, which is incorporated by reference in its entirety.

BACKGROUND OF THE INVENTION

The present invention generally relates to a method for manufacturing a semiconductor device, and more specifically, to a method of forming a spacer on side and top portions of a photoresist pattern after a mask process so that the spacer may be used as an etching mask, thereby simplifying a spacer patterning technology (SPT) process.

Due to high-integration of semiconductor devices, the size and pitch of patterns for forming circuits is reduced. According to Rayleigh's equation, a size of a fine pattern in a semiconductor device is in proportion to a wavelength of light used in the exposure process and is in inverse proportion to a size of a lens in an exposer. Thus, methods for reducing the wavelength of light used in the exposure process or enlarging the size of the lens have been used to form fine patterns.

Various photo processes have overcome technical limits in the manufacture of semiconductor devices by the fine design of masks to adjust the amount of light transmitted through the mask, by the development of new photoresist materials, by the development of scanners using a high numerical aperture lens and by the development of a transformed mask.

However, it is difficult to form a desired width and pitch of patterns due to limits of exposure and resolution capacity using currently available light sources, e.g., KrF and ArF. For instance, exposure technologies to manufacture patterns of about 60 nm have been developed, but making patterns less than 60 nm becomes problematic.

Various studies have been conducted to form a photoresist pattern having a size and pitch of a fine pattern.

One of those studies is a double patterning technology (DPT) of performing double photo processes to form a pattern.

In one example of DPT, a double exposure etch technology (DE2T) includes exposing and etching a first pattern having a double cycle, and exposing and etching a second pattern having a double cycle between the first patterns. In another example of DPT, a spacer patterning technology (SPT) includes forming a pattern using a spacer.

Both the DE2T and the SPT may be performed with a negative tone and a positive tone.

In the negative tone DE2T, a pattern obtained from a first mask process is removed in a second mask process to form a desired pattern. In the positive tone DE2T, patterns obtained from a first mask process and a second mask process are combined to form a desired pattern.

The SPT is a self-aligned method that comprises performing a mask process once to pattern a cell region, thereby preventing mis-alignment.

However, in order to form a pad pattern in a core and peripheral circuit regions, an additional mask process is required to separate a pattern part of a mat edge region. Also, it is difficult to control deposition uniformity of a spacer forming region and regulate a critical dimension (CD) in a spacer etching process.

Although the SPT is singly applied to a NAND flash process in the case of a multi-layered structure including a line/space, a pattern cannot be formed by the SPT in the case of brick wall patterns of a DRAM and complicated pattern layers. In this case, the DE2T is required.

BRIEF SUMMARY OF THE INVENTION

Various embodiments of the present invention are directed at providing a method for manufacturing a semiconductor device that includes performing a simple SPT process, thereby reducing turn-around-time (TAT) and cost.

According to an embodiment of the present invention, a method for manufacturing a semiconductor device includes forming a bottom anti-reflection coating film over an etch-target layer, patterning a photoresist layer formed over the bottom anti-reflection coating film, forming an insulation layer over a patterned photoresist layer and the bottom anti-reflection coating film, etching back the insulation layer to form a spacer on sidewalls of the patterned photoresist layer, and etching the bottom anti-reflection coating film and the etching target layer exposed by the spacer to form a fine pattern.

Preferably, the insulation layer is deposited at a temperature in a range of about 75 to 220° C.

Preferably, the insulation layer is an oxide layer, a nitride layer, or a combination thereof.

Preferably, a pitch of the patterned photoresist layer is approximately twice as wide as a pitch of the fine pattern.

Preferably, the insulation layer is etched back in an atmosphere including $CF_4$.

Preferably, a critical dimension of the spacer is substantially the same as a critical dimension of the patterned photoresist layer.

Preferably, depositing the insulation layer comprises: forming a first catalytic mono layer over the bottom anti-reflection coating film and the photoresist pattern; forming a first organo silicate over the first catalytic mono layer; forming a second catalytic mono layer over the first organo silicate; forming a second organo silicate over the second catalytic mono layer; and forming a third catalytic mono layer over the second organo silicate.

According to an embodiment of the present invention, a method for manufacturing a semiconductor device includes forming a bottom anti-reflection coating film over an etch-target layer; forming a photoresist pattern over the bottom anti-reflection coating film; depositing an insulation layer over the photoresist pattern and the bottom anti-reflection coating film; etching the insulation layer to form a spacer on sidewalls of the photoresist pattern, wherein the photoresist pattern is exposed by the spacer; and etching the photoresist pattern, the bottom anti-reflection coating film and the etch-target layer using the spacer as an etch mask to form a fine pattern.

Preferably, the spacer is an oxide layer, a nitride layer, or a combination thereof.

Preferably, a pitch of the photoresist pattern is approximately twice as wide as a pitch of the fine pattern.

Preferably, a critical dimension of the spacer is substantially the same as a critical dimension of the photoresist pattern.

Preferably, the etched insulation layer and the etched bottom anti-reflection coating film are removed.

Preferably, the insulation layer is deposited at a temperature in a range of about 75 to 220° C.

Preferably, the insulation layer is etched back in atmosphere including $CF_4$.

Preferably, depositing the insulation layer comprises: forming a first catalytic mono layer over the bottom anti-reflection coating film and the photoresist pattern; forming a first organo silicate over the first catalytic mono layer; forming a second catalytic mono layer over the first organo silicate; forming a second organo silicate over the second catalytic mono layer; and forming a third catalytic mono layer over the second organo silicate.

DESCRIPTION OF EMBODIMENTS

In a SPT process, it is necessary to adjust accurately a size of a pattern and a thickness of a spacer deposition material formed at a side of the pattern in order to form a line pattern. That is, the spacer deposition material is required to have an excellent step coverage, and it is necessary to minimize damage to lower materials when a partition is wet-stripped. Before a spacer is formed, a line pattern and a pad pattern included in the partition are formed by a mask process. The sizes of the line pattern and the pad pattern are determined depending on a width of the spacer. As a result, fine and accurate control of overlay is required to reduce defects of the device manufactured by the SPT method.

Generally, in the mask process, a bottom anti-reflected coating (BARC) film and a photoresist film which are formed by a spin-on process require baking processes performed at 200~300° C. and 90~150° C. after a coating process. The baking process eliminates and anneals residual moisture which is 80% removed by the spin-on process.

Since a polymer is burned when the polymer is heated to 300° C. or more, it is possible to form a material layer to be used as a spacer by a general deposition process using a furnace. The material layer is formed over the BARC and the photoresist film.

However, in comparison to chemical vapor deposition (CVD) and physical vapor deposition (PVD) processes, a low temperature deposition can be performed in an atomic layer deposition (ALD) process applied to a process that requires excellent step coverage.

The present invention provides a method of forming a spacer using a polymer deposition layer (PDL) which is a low temperature oxide or nitride that can be deposited on side and top portions of the photoresist pattern at 75~220° C. after the mask process is performed.

The PDL process performed as a CVD process using a catalyst is a deposition method using a catalyst and an organo-silicon precursor alternately.

The PDL process can reduce the steps of the SPT process because the deposition process can be performed at low temperature (75~220° C.), and have a high aspect ratio (e.g., 25:1) with an excellent step coverage like the ALD process.

FIGS. 1a to 1f are cross-sectional diagrams illustrating a polymer deposition layer (PDL) process according to an embodiment of the present invention.

Figure 1A:
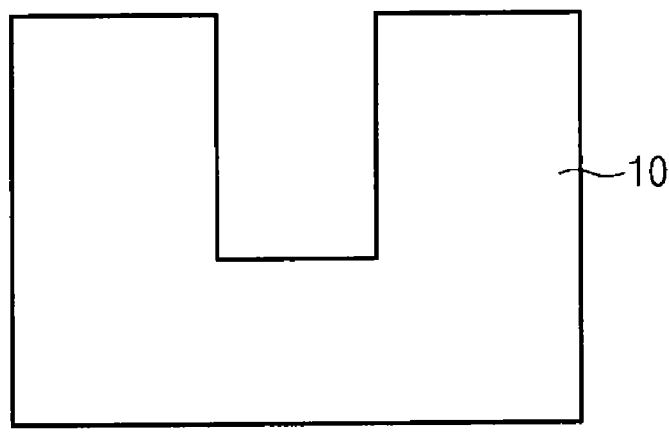
FIGS. 1a to 1f are cross-sectional diagrams illustrating a polymer deposition layer (PDL) process according to an embodiment of the present invention.

Referring to FIG. 1a, a sub pattern includes a photoresist pattern 10.

Figure 1B:
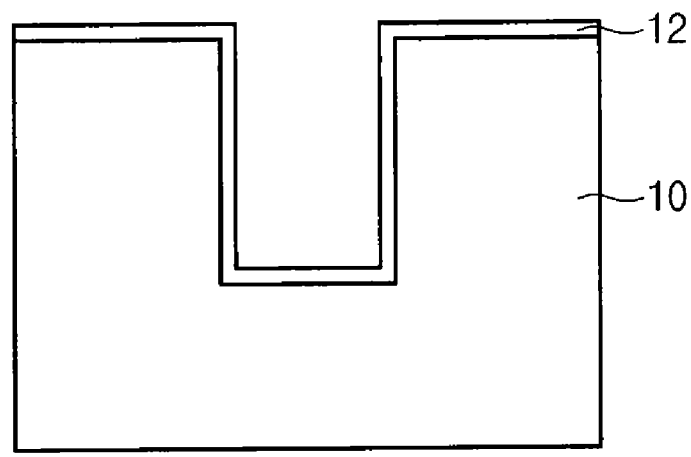

Referring to FIG. 1b, a catalyst material is thinly coated over the photoresist pattern 10 to form a first catalytic mono layer 12.

Figure 1C:
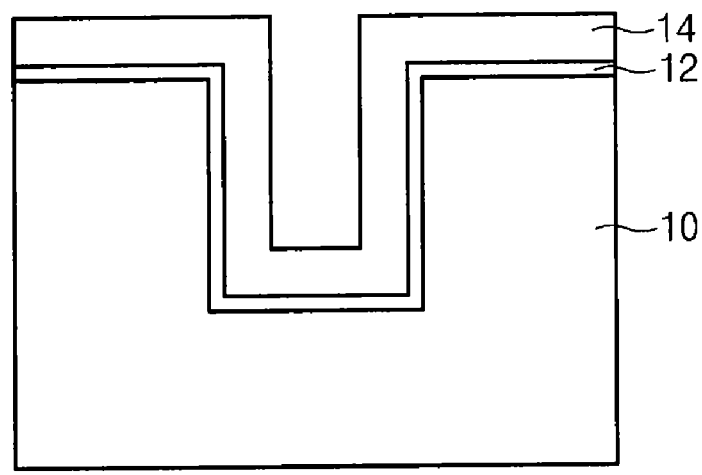

Referring to FIG. 1c, a first organo silicate 14 which is an organo-silicon precursor reacts to the first catalytic mono layer 12 to grow a crosslink layer. The growth of the first organo silicate 14 is limited by a supply of a precursor molecule of the first catalytic mono layer 12. The growth speed of the first organo silicate 14 is faster than that of the ALD process.

Figure 1D:
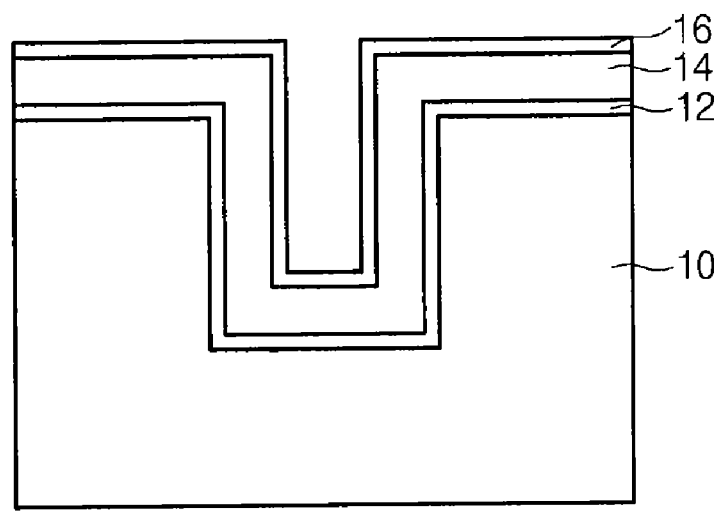
Figure 1E:
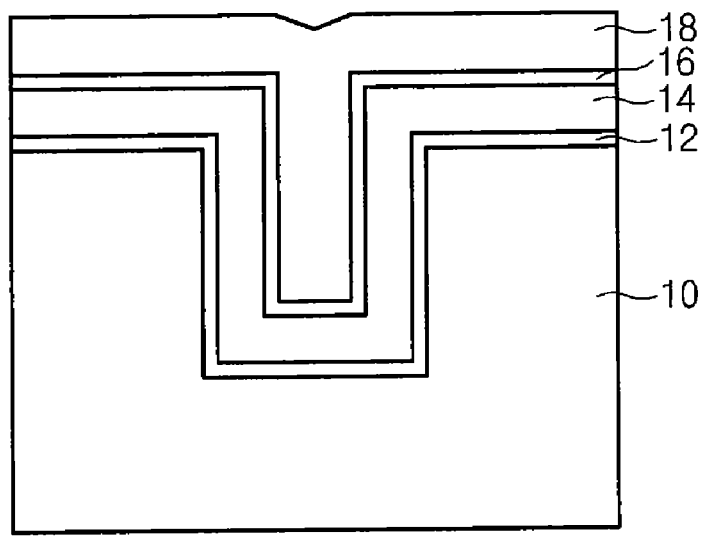

Referring to FIGS. 1d and 1e, a second catalytic mono layer 16 is coated over the first organo silicate 14, and a second organo silicate 18 is grown over the second catalytic mono layer 16.

Figure 1F:
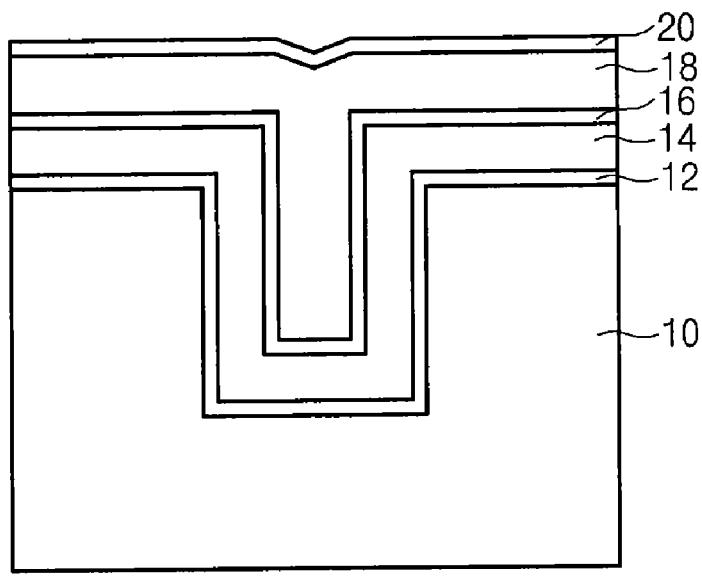

Referring to FIG. 1f, a third catalytic mono layer 20 is formed over the second organo silicate 18.

In the PDL process, the steps of coating the catalytic mono layers 12, 16 and of depositing the organo silicates 14, 18 are repeated until they have a desired thickness, thereby obtaining a layer having an excellent step coverage.

FIGS. 2a to 2f are cross-sectional diagrams illustrating a positive tone SPT process including a PDL process according to an embodiment of the present invention. FIGS. 2a to 2f show when a control gate stack of a flash memory is formed.

Figure 2A:
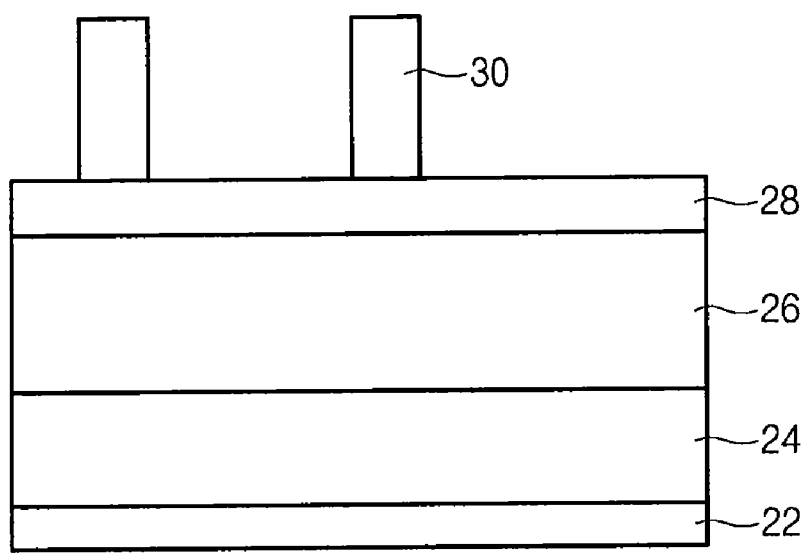
FIGS. 2a to 2f are cross-sectional diagrams illustrating a positive tone SPT process including a PDL process according to an embodiment of the present invention.

Referring to FIG. 2a, after a device isolating film that defines an active region is formed over a semiconductor substrate, a capping silicon nitride oxide (SiON) film 22 for forming a sub stack is formed over a lower structure including an ONO dielectric film, a gate poly and a tungsten silicide (WSi).

A tetra ethyl ortho silicate (TEOS) 24 and a poly 26 for a hard mask are deposited over the SiON film 22, and a BARC 28 is formed over the poly 26.

A photoresist film is coated over the BARC 28. An exposure and developing process is performed on the photoresist film with a mask where a pattern having a pitch twice as large as a desired pitch to form a photoresist pattern 30. For example, when a line is formed to have a CD of 40 nm regardless of an etch bias, a space is formed to have a CD of 120 nm. That is, a ratio of line/space is 1:3.

Figure 2B:
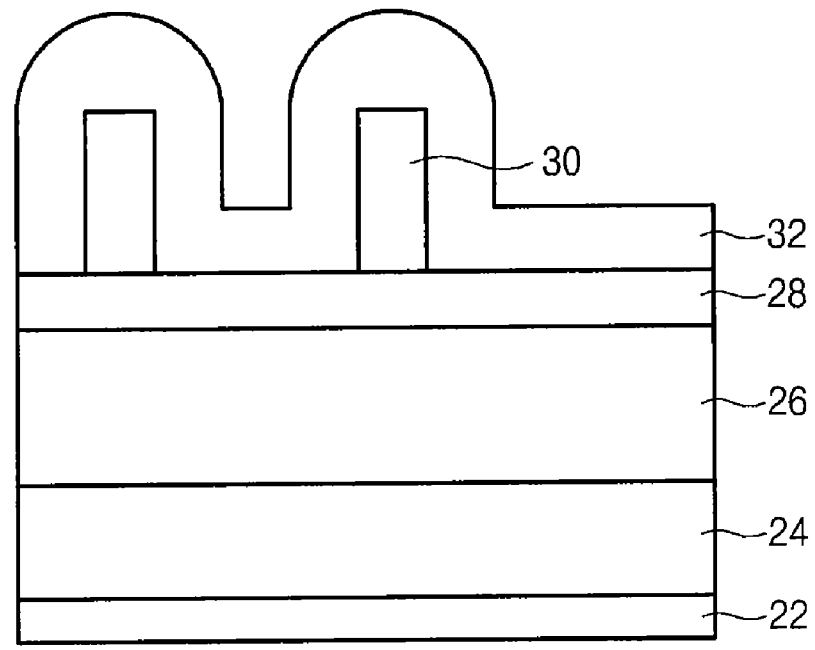

Referring to FIG. 2b, the PDL process (as described with reference to FIGS. 1a-1f) is performed to form a spacer material layer 32 over the BARC 28 including the photoresist pattern 30. The PDL process is performed at a low temperature ranging from 75 to 220° C. so that a profile of the BARC 28 is not degraded.

Figure 2C:
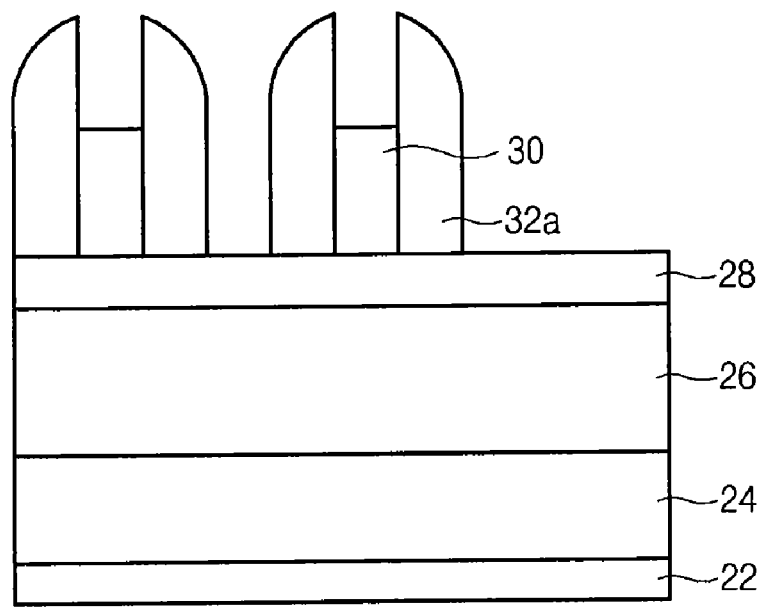

Referring to FIG. 2c, a dry etch-back process is performed on the spacer material layer 32 to expose the photoresist pattern 30 and form a spacer 32a. The spacer 32a is formed to have the same thickness as a CD of the photoresist pattern 30. Since $CF_4$ is used as an etching gas, a part of the photoresist pattern 30 is removed.

Figure 2D:
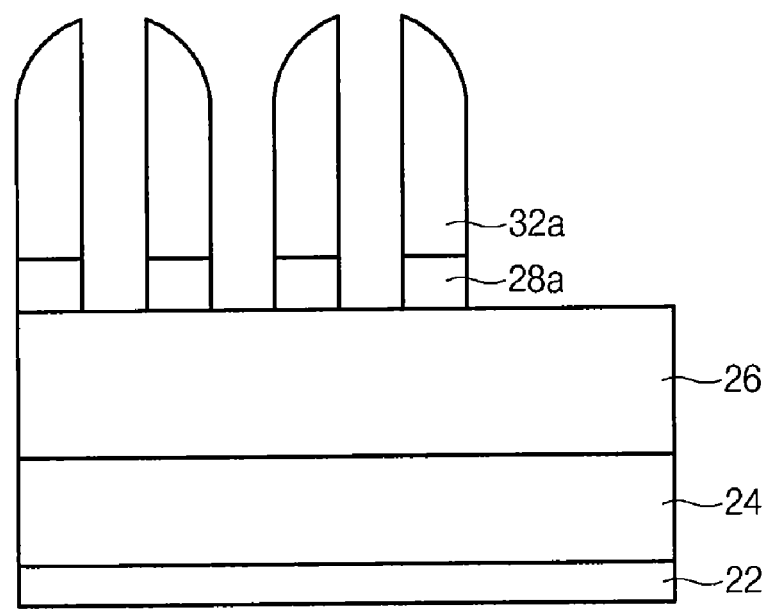

Referring to FIG. 2d, the photoresist pattern 30 is removed in an $O_2$ atmosphere. The BARC 28 is etched using the spacer 32a as an etching mask to form a BARC pattern 28a.

Figure 2E:
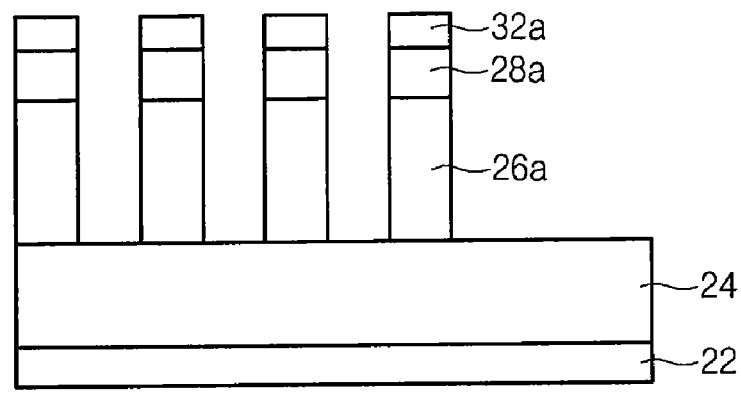

Referring to FIG. 2e, the hard mask poly 26 is etched using the spacer 32a and the BARC pattern 28a as an etching mask to form a hard mask poly pattern 26a.

Figure 2F:
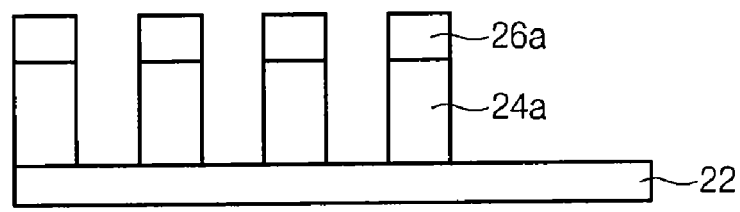

Referring to FIG. 2f, the spacer 32a and the BARC pattern 28a are removed. The hard mask TEOS 24 is etched using the hard mask poly pattern 28a as an etching mask to form a hard mask TEOS pattern 24a.

The SiON film 22 is etched using the hard mask poly pattern 26a and the TEOS pattern 24a as an etching mask to form a fine pattern having a small pitch that cannot be formed by a conventional exposer.

As described above, according to an embodiment of the present invention, a spacer material is formed over a photoresist pattern by a PDL process at a low temperature (75~220° C.) after a mask process is performed. As a result, a SPT process can be simply performed to reduce TAT and manufacturing costs. Specifically, in the prior art, a spacer material cannot be formed over a conventional photoresist pattern so that a poly film used as a pattern and an amorphous carbon film for patterning the poly film are additionally formed. However, a spacer material is directly formed over a photoresist pattern in the embodiment of the present invention, thereby simplifying the process steps.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
   forming a bottom anti-reflection coating film over an etch-target layer;
   patterning a photoresist layer formed over the bottom anti-reflection coating film;
   depositing an insulation layer over the patterned photoresist layer and the bottom anti-reflection coating film by using a polymer deposition layer (PDL) process, wherein the PDL process includes forming a catalytic layer and an organo silicate;
   etching back the insulation layer to form a spacer on sidewalls of the patterned photoresist layer; and
   etching the bottom anti-reflection coating film and the etch-target layer exposed by the spacer to form a fine pattern.

2. The method according to claim 1, wherein the insulation layer is deposited at a temperature in a range of about 75 to 220° C.

3. The method according to claim 2, wherein the insulation layer is one selected from the group consisting of an oxide layer, a nitride layer, and a combination thereof.

4. The method according to claim 1, wherein a pitch of the patterned photoresist layer is twice as wide as a pitch of the fine pattern.

5. The method according to claim 1, wherein the insulation layer is etched back in an atmosphere including $CF_4$.

6. The method according to claim 1, wherein a critical dimension of the spacer is substantially the same as a critical dimension of the patterned photoresist layer.

7. The method according to claim 1, wherein depositing the insulation layer comprises:
   forming a first catalytic mono layer over the bottom anti-reflection coating film and the photoresist pattern;
   forming a first organo silicate over the first catalytic mono layer;
   forming a second catalytic mono layer over the first organo silicate;
   forming a second organo silicate over the second catalytic mono layer; and
   forming a third catalytic mono layer over the second organo silicate.

8. A method for manufacturing a semiconductor device, the method comprising:
   forming a bottom anti-reflection coating film over an etch-target layer;
   forming a photoresist pattern over the bottom anti-reflection coating film;
   depositing an insulation layer over the photoresist pattern and the bottom anti-reflection coating film by using a polymer deposition layer (PDL) process, wherein the PDL process includes forming a catalytic layer and an organo silicate;
   etching the insulation layer to form a spacer on sidewalls of the photoresist pattern, wherein the photoresist pattern is exposed by the spacer; and
   etching the photoresist pattern, the bottom anti-reflection coating film and the etch-target layer using the spacer as an etch mask to form a fine pattern.

9. The method according to claim 8, wherein the spacer is one selected from the group consisting of an oxide layer, a nitride layer, and a combination thereof.

10. The method according to claim 8, wherein a pitch of the photoresist pattern is twice as wide as a pitch of the fine pattern.

11. The method according to claim 8, wherein a critical dimension of the spacer is substantially the same as a critical dimension of the photoresist pattern.

12. The method according to claim 8, further comprising:
    removing the etched insulation layer and the etched bottom anti-reflection coating film.

13. The method according to claim 8, wherein the insulation layer is deposited at a temperature in a range of about 75 to 220° C.

14. The method according to claim 8, wherein the insulation layer is etched in an atmosphere including $CF_4$.

15. The method according to claim 8, wherein depositing the insulation layer comprises:
    forming a first catalytic mono layer over the bottom anti-reflection coating film and the photoresist pattern;
    forming a first organo silicate over the first catalytic mono layer;
    forming a second catalytic mono layer over the first organo silicate;
    forming a second organo silicate over the second catalytic mono layer; and
    forming a third catalytic mono layer over the second organo silicate.

* * * * *